United States Patent [19]

Rolland

[11] Patent Number: 5,054,119

[45] Date of Patent: Oct. 1, 1991

[54] ANTI-THEFT SYSTEM FOR A RADIO RECEIVER USED PARTICULARLY IN A MOTOR VEHICLE

[76] Inventor: Marie-Christine Rolland, 38 rue de la Fédération, Paris, France

[21] Appl. No.: 381,645

[22] PCT Filed: Oct. 12, 1988

[86] PCT No.: PCT/FR88/00505

§ 371 Date: Jun. 9, 1989

§ 102(e) Date: Jun. 9, 1989

[87] PCT Pub. No.: WO89/03325

PCT Pub. Date: Apr. 20, 1989

[30] Foreign Application Priority Data

Oct. 12, 1987 [FR] France .................. 87 14030
Nov. 9, 1987 [FR] France .................. 87 15472

[51] Int. Cl.5 .................. H04B 1/08; H05K 11/02
[52] U.S. Cl. .................. 455/346; 455/348
[58] Field of Search ............. 455/186, 41, 346, 347, 455/348, 349, 345; 361/400, 422, 425; 333/24 C

[56] References Cited

U.S. PATENT DOCUMENTS

| 3,848,164 | 11/1974 | Otte | 333/24 C |
|---|---|---|---|
| 4,248,095 | 2/1981 | Akatsu et al. | 340/870.13 |
| 4,339,668 | 7/1982 | Mueller et al. | 333/24 C |
| 4,409,590 | 10/1983 | Baker | 455/41 |
| 4,481,512 | 11/1984 | Cheulin et al. | 455/346 |
| 4,621,373 | 11/1986 | Hodsdon | 455/347 |
| 4,623,992 | 11/1986 | Kurosaki et al. | 455/347 |
| 4,683,462 | 7/1987 | Takeda et al. | 455/158 |
| 4,704,740 | 11/1987 | Mckee et al. | 455/348 |
| 4,785,202 | 11/1988 | Toyoda | 333/24 C |
| 4,940,414 | 7/1990 | Lee | 455/349 |

FOREIGN PATENT DOCUMENTS

| 2461409 | 1/1981 | France . |
|---|---|---|
| 2519832 | 7/1983 | France . |
| 2592846 | 7/1987 | France . |
| 446750 | 11/1966 | Switzerland . |
| 0116780 | 8/1984 | World Int. Prop. O. . |

OTHER PUBLICATIONS

Radio Electronics, David Thomas, Health's Digital FM Tuner, May 1976, pp. 42–50,93.

Primary Examiner—Reinhard J. Eisenzopr
Assistant Examiner—Lisa D. Chavouel
Attorney, Agent, or Firm—Kenyon & Kenyon

[57] ABSTRACT

The present invention relates to a system for receiving radio-waves used in a motor vehicle. The system is characterized in that it comprises an amplification unit (3) presenting a housing (5) of a removable tuner control part (4) which, when introduced in the housing (5) is electrically connected to the amplification unit (3) in order to make the reception system operative. The present invention applies particularly to the protection against theft of car radios.

12 Claims, 5 Drawing Sheets

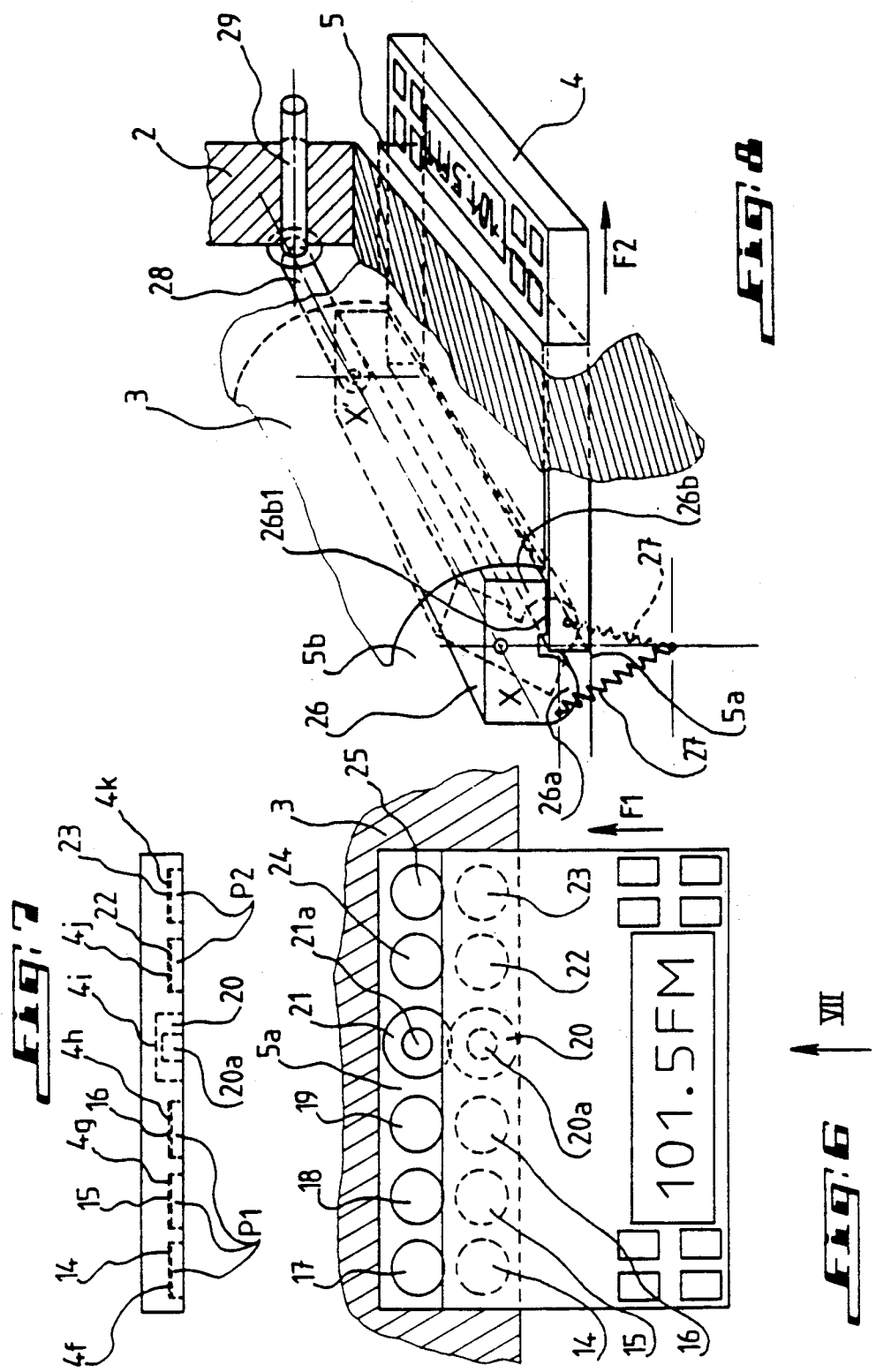

ANTI-THEFT SYSTEM FOR A RADIO RECEIVER USED PARTICULARLY IN A MOTOR VEHICLE

BACKGROUND OF THE INVENTION

The present invention relates to a thief-proof system for radio receivers used in particular in an automotive vehicle.

Radio receivers mounted in particular in automotive vehicles are so coveted that a number of parked vehicles are broken into in order to steal for example through pulling out, the radio receiver.

In order to dissuade people from stealing radio receivers, it has already been proposed to mount in a removable manner the radio receiver on the dashboard of the vehicle.

However, due to the bulkiness of the radio receiver, the owner of the vehicle when he leaves it parked for a limited duration, often hides the radio receiver inside his vehicle, for example under a front seat thereof. This behaviour is well known from the thieves, so that they just have to break a window of the vehicle and to take rapidly the hidden radio receiver.

SUMMARY OF THE INVENTION

The present invention provides a system dissuading any people from coveting a radio receiver mounted inside an automotive vehicle.

For this purpose, the system for receiving radio waves according to the invention, used in particular in an automotive vehicle and of the type comprising essentially an audio amplifying unit solid in an inviolable manner with a stationary part of the vehicle such as the dashboard and a part for controlling the selection of the radio waves or tuner control, fastened in a removable manner to the amplifying unit and connected to the same through the medium of electric connection means making the tuner control unit operational, is characterized in that the amplifying unit comprises a housing for receiving the tuner control unit for electrically connecting the same to the amplifying unit and in that the tuner control unit presents on its visible outer part, once received in the housing, elements for controlling the search for radio waves frequencies and for selecting the waves and a device for displaying in particular the search frequencies.

According to an advantageous feature of the invention, the tuner control unit is in the shape of a flat right angled parallelepiped having a size similar to that of a credit card.

Thus, before leaving his vehicle, the user simply removes the tuner control from the amplifying unit so that the later be practically hidden and, due to the low bulkiness of the tuner control unit, the user can carry it away for example in his pocket.

Preferably, the amplifying unit is fastened behind the dashboard of the vehicle which comprises an aperture in front of the inlet of the housing of the amplifying unit for the passage of the tuner control.

The aforesaid electrical connecting means are formed of plugging means comprising a connector received in the lower part of the housing of the amplifying unit and comprising a certain number of resilient metallic strips cooperating respectively with metallic contacts which are solid with the tuner control unit.

It may be desirable not to effect the connection of the tuner control unit to the amplifying unit through the medium of the metallic strip-electrical contact assembly for reasons or reliability. Indeed, the extraction and the insertion of the tuner control unit from and into the amplifying unit can occur often during the day, so that a rapid wearing of the contacts is likely to occur. Moreover, these contacts may deteriorate due to the presence of metallic articles, such as a key and/or a coin during the transport of the tuner control unit inside a pocket.

To solve these problems, the system according to the invention provides also means for connecting the tuner control unit to the amplifying unit comprising a capacitive coupling-type connection for the transmission of high frequency signals coming from the antenna to the high frequency circuits of the tuner control unit, a capacitive coupling-type connection for the transmission of low frequency signals from the tuner control unit to the low frequency amplifyier of the amplifying unit and a electromagnetic coupling-type connection for the power supply of the tuner control unit.

According to another feature of the invention, the capacitive connection for the transmission of high frequency signals comprises two capacitors each formed of two metallic plates disposed opposite to each other when the tuner control unit is inserted, located respectively in the amplifying unit and in the tuner control unit, preferably in the lower face of the latter and separated by a plate of a dielectric material, such as ceramics, solid with the plate of the tuner control unit.

According to still another feature of the invention, the capacitive connection of the transmission of low frequency signals comprises at least three capacitors, one for each stereophonic channel and one for the return of the current, each comprising two metallic plates disposed opposite to each other when the tuner control unit is inserted, located respectively in the amplifying unit and in the tuner control unit, preferably in the lower face of the latter and separated by a plate of a dielectric material, such as ceramics, solid with the plate of the tuner control unit.

Preferably, the aforesaid dielectric material has a relative permittivity between 500 to 2000.

According to still another feature of the invention, the electromagnetic coupling-type connection comprises two coupled windings located respectively in the amplifying unit at the output of a direct current-alternating current converter and in the tuner control unit, preferably in the lower face thereof.

Advantageously, the system of the invention further comprises a mechanical device released during the insertion of the tuner control unit into the amplifying unit to press the rear part of the tuner control unit in order to perfectly ensure the aforesaid connections.

Moreover, the system of the invention comprises a knob for controlling the ejection of the tuner control unit out of the housing of the amplifying unit.

Preferably, a secret code is memorized in the tuner control unit and is compared to another secret code memorized in the amplifying unit and the putting into operation of the system is validated when a matching between the two secret codes is ascertained, the comparison occuring for example as soon as the amplifying unit is fed.

This latter feature is interesting as it completely dissuades any people from appropriating the amplifying unit solid with the dashboard of the automotive vehicle since the same would be totally unusable in the absence of the tuner control unit which normally should be associated to it.

BRIEF DESCRIPTION OF THE DRAWINGS

For fuller understanding of the invention, reference is made to the following description taken in conjunction with the accompanying drawings, in which:

FIG. 6 is a top view in particular of the tuner control unit according to a second embodiment;

FIG. 7 is a view in the direction of arrow VII of FIG. 6;

FIG. 8 is a perspective view showing a mechanical device for maintaining the tuner control unit in the housing of the amplifying unit.

DETAILED DESCRIPTION OF THE PREFERRED EMBODIMENTS

Figure 1:
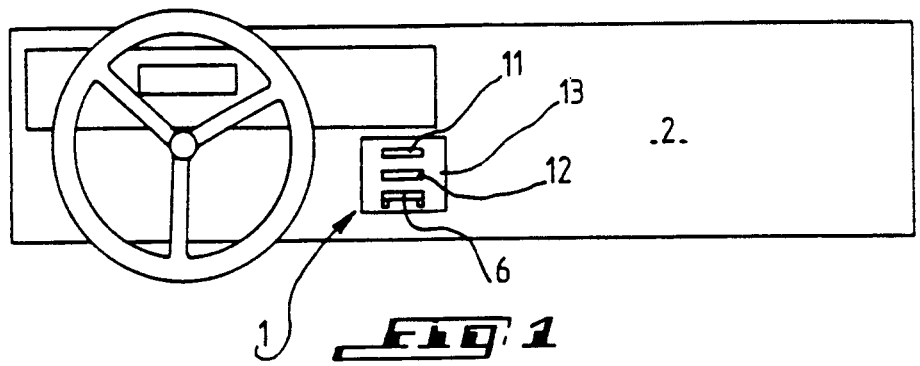
FIG. 1 is a front view of a dashboard of an automotive vehicle comprising the system according to the invention.
Figure 2:
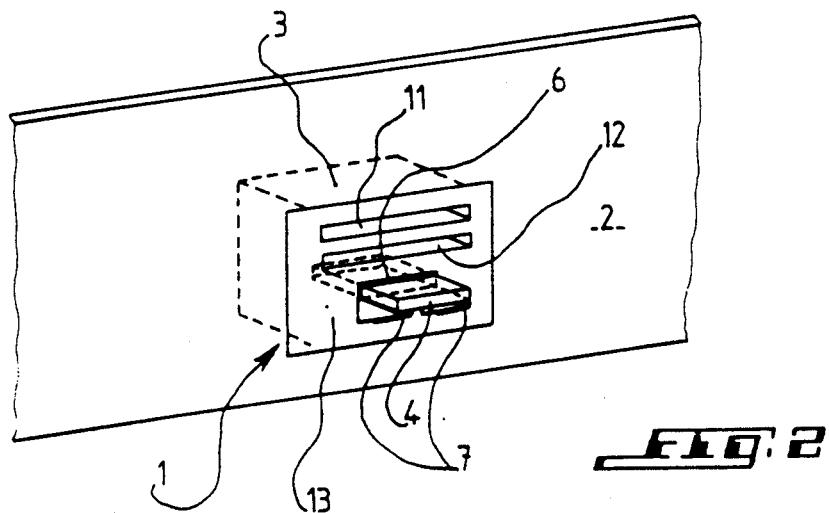
FIG. 2 is an enlarged perspective view in the direction of arrow II of FIG. 1 of the system of the invention.
Figure 3:
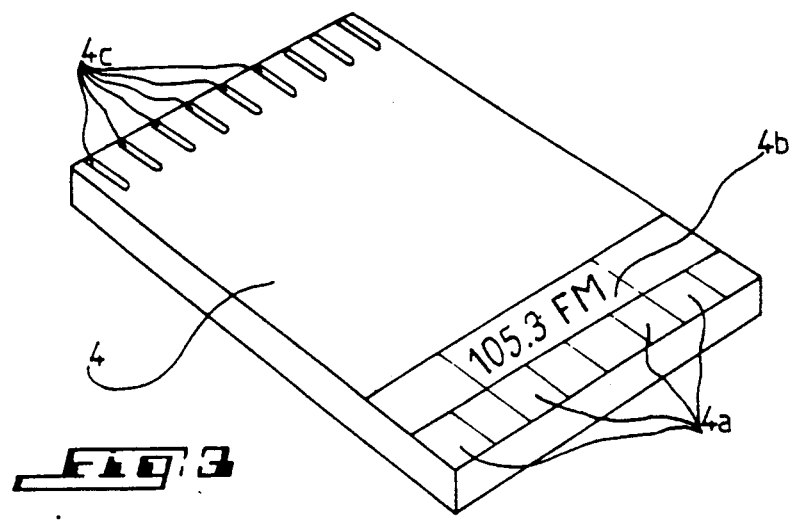
FIG. 3 is a perspective view of the tuner control unit according to a first embodiment.
Figure 4:
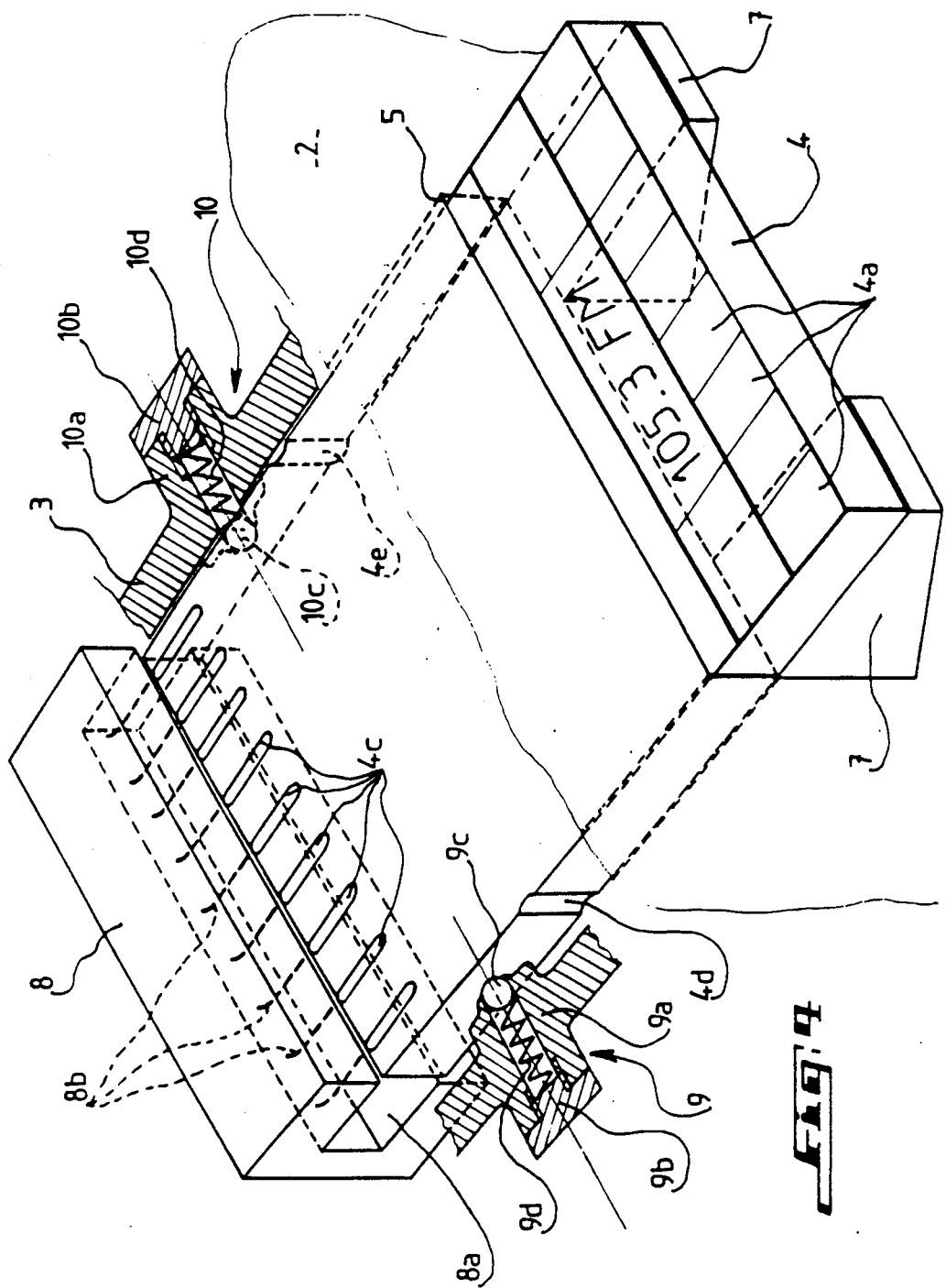
FIG. 4 is a partially broken way perspective view showing the mounting of the tuner control unit on a connector of the amplifying unit according to the invention.

Referring to FIGS. 1 to 5, a radio receiver 1 is mounted on a stationary part 2 of a vehicle constituted for example by the dashboard thereof. The radio receiver 1 comprises two separated parts, one part 3 forming a frame or amplifying unit solid in an inviolable manner, for example by fastening screws (not shown), with the rear face of the dashboard 2 and one part 4 for controlling the taking and the selection of AM or FM radio waves or tuner control unit with digital control keys 4a for example of the touch contact type for searching for frequencies and for selecting the radio waves and with a display device 4b, in particular with liquid crystals, for the searched for frequencies and stations. The tuner control unit 4 is removably mounted in the supply unit 3 and is in the shape of a right angled parallelepipedic flat casing having sizes similar to the sizes of a payment card or a credit card and likely to be engaged in a central housing 5 having a shaped conjugate to that of the amplifying unit 3. In order to permit inserting the unit 4 inside the housing 5, the dashboard 2 comprises a rectangular opening 6 located opposite the housing 5. The tuner control unit 4, when arranged longitudinally inside housing 5, leaves outside and therefore visible about one third of its surface so that the control keys 4a be accessible and that the display device 4b in particular for the selected frequency and the AM or FM wave range chosen, be also visible, the keys 4a and the display device 4b being located on the upper face of unit 4. This surface portion of unit 4 which protrudes outwardly is carried by a pedestal 7 made of hard rubber solid with the front face of the dashboard 2.

The unit 4 also comprises a certain number of metallic elements forming contact studs 4c arranged longitudinally to the unit 4 and in parallel relationship to each on the upper surface of unit 4 opposite to the control keys 4a. The contact elements 4c are electrically connected to the different electronic circuits arranged inside the casing of unit 4 and which will be defined later. A connector 8, in the shape of a parallelepipedic bar, is fastened in the bottom part of the housing 5 and comprises a groove 8a for receiving an end part of the casing of unit 4. The connector 8 comprises several approximately curvilinear resilient parallel metallic strips 8b fastened to the upper face of groove 8a and ensuring electrical connections by pressing respectively on the contact elements 4c when the end part of the casing of unit 4 is inserted in groove 8a. Unit 4 is maintained in this inserted position by two retractable pusher-forming elements 9 and 10 solid with the amplifying unit 3 and located in aligned relationship on both sides of unit 4, symmetrically to the longitudinal axis of the same. More precisely, each push element 9, 10 comprises a tubular part 9a, 10a solid with the unit 3 and one end of which is obturated by a removable plug 9b, 10b accessible from the outside of unit 3 whereas the opposite end comprises one ball 9c, 10c one part of which protrudes outwardly from the corresponding tubular part in order to be inserted resiliently in a corresponding housing 4d, 4e formed in a side face of the casing of unit 4. The housings 4d and 4e both present a shape of an elongated notch with a curveted bottom perpendicular to the upper plane face of unit 4 and are arranged symmetrically to the longitudinal axis of unit 4. It is of course possible to impart another shape to the housings 4d and 4e, for example the shape of a spherical cap. Each ball 9b, 10b is maintained at the corresponding end of the tubular part 9, 10 by a resilient return element, such as a spring 9d, 10d coaxially mounted in a prestressed manner in the corresponding tubular part.

Figure 5:
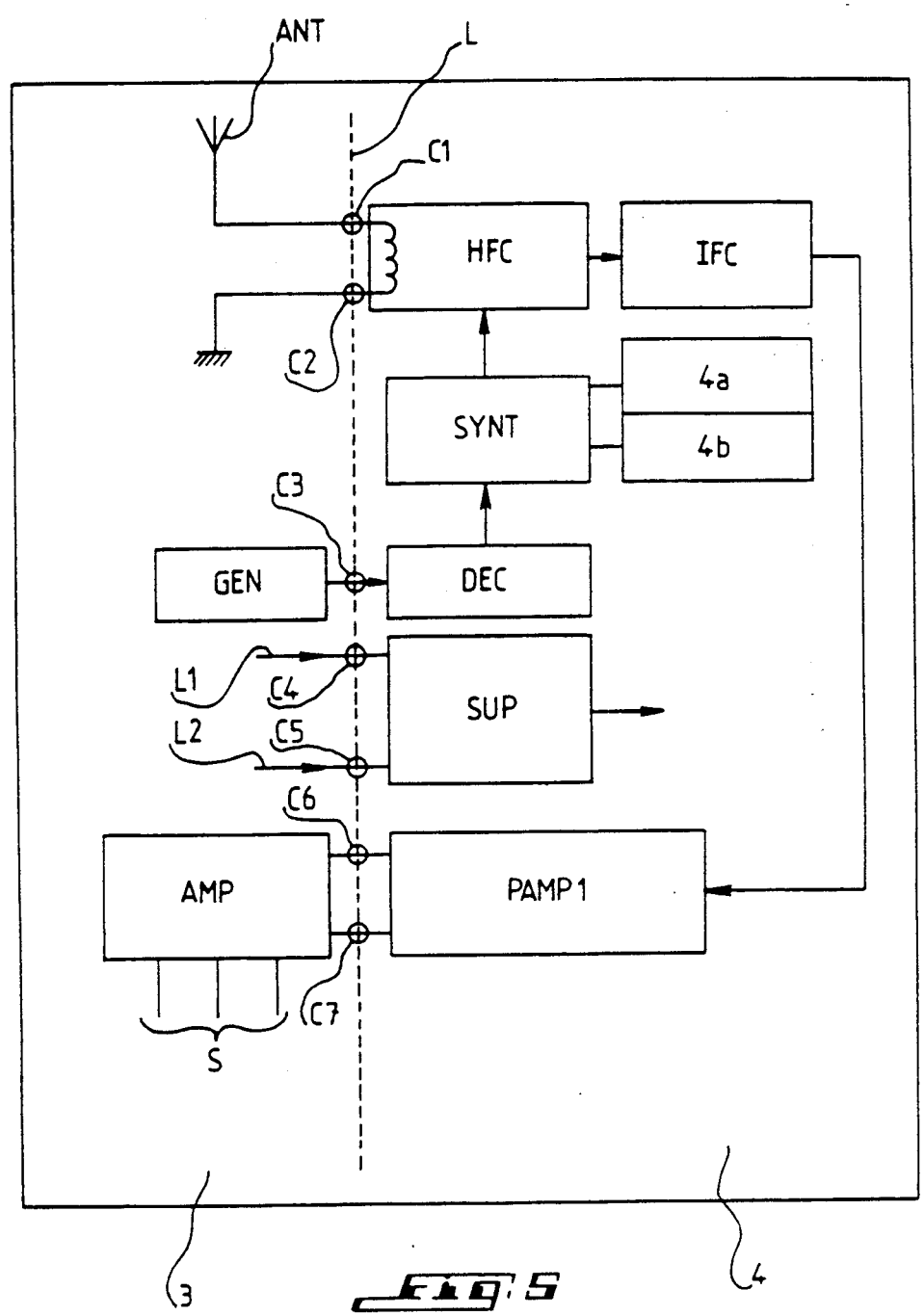
FIG. 5 shows in the form of a block diagram the different electronic elements located respectively in the tuner control unit and in the amplifying unit of the system of the invention.

FIG. 5 shows the different electronic circuits present respectively in the stationary part forming the amplifying unit 3 and in the removable part constituted by the tuner control unit 4, the separation between these two parts being symbolized by the dotted line L. On this line L are symbolized the electrical connections C1 to C7 established when the resilient strips 8b are in contact respectively on the contact plugs 4c once the tuner control unit 4 inserted inside housing 5. Thus, the amplifying unit 3 comprises one low frequency amplifying circuit AMP of which both outputs S are connected to loudspeakers (not shown) and whose inputs are connected, through the medium of connections C6 and C7, to the corresponding outputs of stereophonic pre-amplifying circuit PAMP1 mounted in the tuner control unit 4. It is to be noted that the electrical connection performed by connection C6 comprises in fact two connecting wires, each for one stereophonic channel, whereas the electrical connection performed by connection C7 comprises at least one wire for the current return. The amplifying unit 3 comprises also the connector (not shown) for connecting to the radio wave receiving antenna symbolized by ANT, and such that the antenna output is connected to the connection C1 and the ground to the connection C2, which connections C1 and C2 connect the antenna to the input of the high frequency circuit HFC of the tuner control unit 4. The connections L1 and L2 symbolize the electric wires for connecting to an electrical supply device, constituted in the present case by the battery of the vehicle, and connected respectively to connections C4 and C5 also connected to the supply device SUP for the different circuits of the tuner control unit 4. Lastly, the amplifying unit 3 comprises a device GEN for generating a secret code preferably established in the factory during the mounting of the radio receiver on the automotive vehicle. This generating device may be of the type comprising a memory in which is memorized the secret code which is supplied at the output of the generating device for example when the amplifying unit 3 is fed. Such a generating device need not be described in detail as it is already known per se. The output of the generating device GEN is connected, through the medium of connection C3, to the input of a decoding circuit DEC of the tuner control unit 4 capable of decoding the secret code memorized in the generating device GEN and, when the latter has been recognized, of transmitting a control signal authorizing the operation of a synthesizing device SYNT of the tuner control unit 4. The decoding device DEC comprises a memory wherein a secret code is memorized before the tuner control unit 4 is delivered to the user of the radio receiver, this code preferably being GEN of the amplifying unit 3. The decoding device DEC further comprises a comparator connected to the generating device GEN through connection C3 and to the memory of decoding circuit DEC in order to compare the two secret codes, and, in case of similarity of these codes, to deliver the control output signal to the synthesizing circuit SYNT. The synthesizing circuit SYNT is connected on the one hand to the control keys 4a and to the display device 4b and on the other hand to the circuit HFC, whose output is connected to an intermediate frequency circuit IFC. The intermediate frequency signal at the output of the circuit IFC, after being demodulated, is applied to the input of the pre-amplifying circuit PAMP1. The circuits HFC, IFC, SYNT, SUP and PAMP1 need not be described in detail as they are conventional circuits.

Reference signs 11 and 12 designate two slots for introducing respectively an analog or digital audio cassette and a laser audio disc each read in the amplifying unit 3, the reproducing means, which are known per se, being not shown for the sake of clarity. The slots 11 and 12 are located above the introduction opening 6 of the tuner control unit 4.

The knobs (not shown) for controlling the adjusting of the volume of the sound and of the balance of the loudspeakers may be disposed near the introduction opening 6 of the tuner control unit 4 on a front panel 13 solid with the front face of the dashboard 2 and comprising various indications concerning in particular the knobs for controlling the adjusting of the sound and of the balance of the loudspeakers. Of course, the front panel 13 comprises rectangular passage or openings communicating respectively with the slots 11, 12 and the opening 6.

The circuits of the tuner control unit 4 may be mounted inside same under the form of plated circuit so that the unit 4 be as compact as possible.

Thus, the tuner control unit 4 can be easily carried by a user inside a pocket and he just has to introduce the unit 4 through the opening 6 in order to insert it in the housing 5 and the connector 8 and to establish the electrical connections defined above between unit 4 and amplifying unit 3 so as to make the radio receiver operational after having recognized the secret codes memorized respectively in the amplifying unit 3 and in unit 4. When he leaves momentarily his vehicle, the user will remove the tuner control unit 4 by releasing if from the resilient holding elements 9 and 10 and putting it again in his pocket. Therefore it will be impossible to steal the amplifying unit 3 without deteriorating strongly the dashboard and the major element of the radio receiver, namely the tuner control unit 4, which thus cannot be stolen since the user, owing to the small size and weight of this unit, similar to those of a credit card, will be able to leave it in his pocket.

The system according to the second embodiment shown in FIGS. 6 to 9 differs from the first embodiment disclosed above only by the lateral introduction of the tuner control unit 4, instead of being introduced longitudinally as disclosed above, and by the electric coupling between unit 4 and amplifying unit 3.

According to this second embodiment, the control keys 4a and the display device 4b are disposed longitudinally on the upper face of the control unit 4 near the edge thereof so as to be visible once unit 4 inserted laterally in its corresponding housing 5, the keys 4a being located on both sides of the display device 4b.

The tuner control unit 4 comprises means cooperating respectively with other means of unit 3 for performing the electrical interconnection between unit 4 and amplifying unit 3 once unit 4 is inserted in its corresponding housing 5. The means of unit 4 are located side by side in an aligned manner near the longitudinal edge of unit 4 parallel to that where the keys 4a and the display device 4b are arranged. These means are arranged in the lower face of unit 4 and comprise first, from the left to the right of FIG. 6 where unit 4 is being inserted in the direction of arrow F1, three metallic plates having the shape of circular pastilles 14–16 each received and fastened, for example by gluing, on the bottom of a corresponding element 4f, 4g, 4h of unit 4 and capable of cooperating respectively with three other metallic plates identical to plates 14–16 having the shape of circular pastilles 17–19 solid, for example by gluing, with the lower horizontal plane face 5a on the bottom of housing 5 of the amplifying unit 3 so that the pairs of plates 14, 17; 15, 18; 16, 19 each form a capacitive coupling for the transmission of low frequency signals between pre-amplifyer PAMP1 of unit 4 and low frequency amplifyer AMP of amplifying unit 3. A circular pastille P1 made from a dielectric material, such as ceramics, is received in each element 4f–4h and is fastened, for example by gluing, to a corresponding metallic plate 14, 15, 16, the pastilles P1 being located respectively between plate 14, 17; 15, 18; 16, 19 in order to form dielectric capacitors. For example, each pastille P1 and therefore each circular plate 14–19 has a diameter of approximately 10 milimeters and each pastille P1 has a thickness of a few tenth of milimeter. Moreover, each pastille P1 has a relative permittivity comprised between 500 and 2000 and is for example formed of ceramics of the type PXE which has been subjected to a depolarisation. The connection means comprise moreover a winding 20 wound about a core 20a perpendicular to the lower face of unit 4, the winding 20-core 20a assembly being received in a housing in the shape of an element 4i formed in the lower face of unit 4. The winding 20 cooperates with an identical winding 21 received in a corresponding element of face 5a so that in the inserted position of plate 4, the windings 20 and 21 are located in opposite relationship one above the other for ensuring an electromagnetic coupling necessary to the electric power supply of the tuner control unit 4. The winding 21 is wound about a core 21a perpendicular to face 5a. Lastly, the connection means comprise two metallic plates having the shape of circular pastille 22, 23 each received on the bottom of a housing forming a corresponding element 4*j* and 4*k* formed in the lower face of unit 4 and fastened by gluing. The two plates 22 and 23 cooperate respectively with two other metallic circular plates with identical dimensions 24 and 25 fastened for example by gluing, on the face 5*a* so that in the semi-inserted position of plate 4 they are in opposite relationship one above the other for ensuring a capacitive coupling for the transmission of high frequency signals between the output of antenna ANT and high frequency circuit HFC of unit 4 and another capacitive coupling ensuring the there and back connection of the necessary current. It is further to be noted that each of the two capacitors formed respectively by plates 14, 17 and 15, 16 corresponds to one stereophonic channel whereas the capacitor formed by plates 16, 19 ensures the necessary return of the current. Finally, two pastilles P2 made from a dielectric material, such as ceramics, are fastened, for example by gluing, respectively to plates 22 and 23 and form two dielectric capacitors in the inserted position of unit 4.

Figure 9:
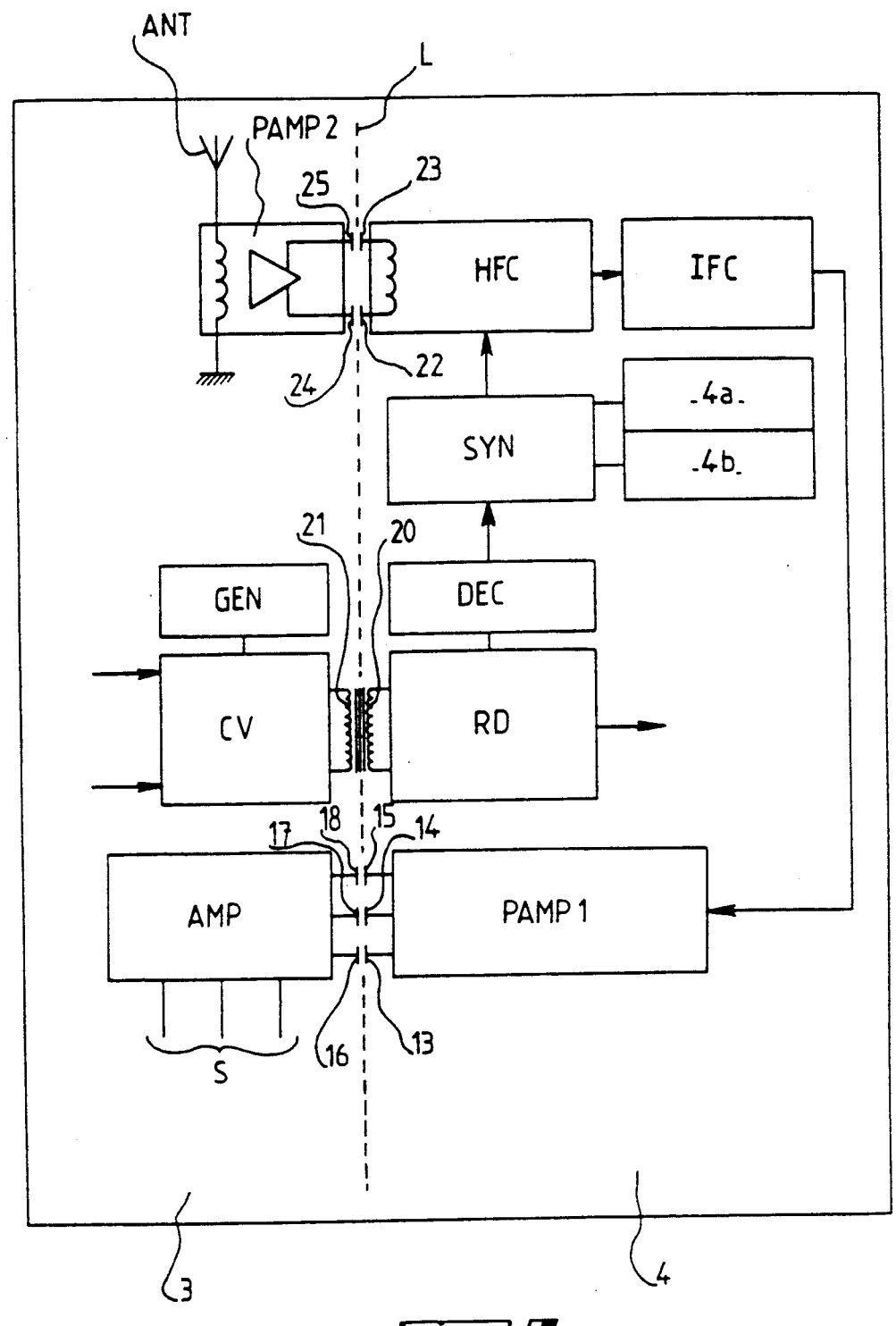
FIG. 9 shows in the form of a block diagrams the electrical elements or circuits existing respectively in the tuner control unit and in the amplifying unit of the system of the invention.

Referring to FIG. 9, where the dotted line L shows the separation between the stationary part of amplifying unit 3 and the removable part constituted by the tuner control unit 4, the different types of coupling defined above are represented by their respective symbols located on line L. This Figure shows the presence of a direct current-alternating current converting circuit CV, constituted for example by a chopper circuit, and converting the direct current of supply from the battery of the vehicle into an alternating circuit for transmitting the electric power of supply to a rectifying circuit RD through the medium of windings 20 and 21, the output of the rectifying supplying the various circuits of unit 4 which are otherwise identical to those shown in FIG. 5 with one difference in that the circuit DEC for decoding the secret code is connected at the output of the rectifying circuit RD so as to receive the secret code from amplifying unit 3 transmitted to the rectifying circuit RD through the medium of the converting circuit CV to which is connected the code generator GEN, which secret code is transmitted to the decoding circuit DEC for example when the supply unit 3 is fed. Reference PAMP2 designates a pre-amplifyer for antenna ANT connected to the high frequency circuit HFC through the medium of capacitors 22, 24 and 23, 25.

Of course, the plates of the different capacitors and the windings shown in FIG. 6 are electrically connected to the different circuits of amplifying unit 3 and of unit 4 in the manner shown in FIG. 9. It is further to be noted that the capacitors formed for the transmission of low frequency signals in the inserted position of unit 4 in the amplifying unit 3 also permit eliminating intermediate frequencies.

FIG. 8 shows a mechanical device permitting pressing the rear part of tuner control unit 4 in order to maintain it in position and to perfectly ensure the capacitive and electromagnetic couplings described above once unit 4 in position of use inside its corresponding housing 5. The bottom of the latter terminates by a cavity 5*b* whose upper wall presents a cross-section substantially in the shape of an arc of a circle and adapted to permit the tilting about its longitudinal axis X-X' of a heel-forming part 26, forming part of the above-mentioned mechanical device, and provoked by the introduction of unit 4 at the bottom 5*b* of its housing 5. The heel-forming part 26 is shown in dotted line in inactive position inclined at about 45° with respect to the horizontal, and is maintained in this position by a return spring 27 fastened at one of its ends to an elongated lower semi-cylindrical part forming a stop 26*a* of the heel-forming part 25 and at its other opposite end to a stationary point of the amplifying unit 3. The semi-cylindrical part 26*a* is connected to an elongated parallelepipedic part 26*b* perpendicular to the part 26*a* and of which one lower plane phase 26*b*1 rests on the upper face of the end part of the control unit 4 in the active position of the heel-forming part 26.

A mechanical ejection device is provided also for ejecting the tuner control unit 4 out of its housing 5. This device comprises one lever arm 28 having one of its ends solids with the extreme face of the heel-forming part 26 opposite to that where one of the ends of the return spring 27 is fastened and its other opposite end connected in an hinged manner to an element 29 forming a push button for ejecting the card 4. The element 29 is slidebly mounted through the front wall of the dashboard 2 and protrudes outwardly from the same in order to be accessible.

Before introducing the tuner control unit 4 into its housing 5, the heel-forming part 26 is in the awaiting position shown in dotted lines. When the unit 4 is introduced into housing 5, the rear end of the same rests against the stop-forming part 26*a* so as to tilt the heel-forming part 26 clockwise in cavity 5*b* about its axis X-X' until the plane face 26*b*1 of part 26*b* rests on plate 4, maintaining the latter correctly in position and ensuring perfectly the capacitive and electromagnetic couplings. The fixing point of the spring to the extreme face of the stop-forming part 26*a* move on an approximately circular trajectory from the position shown in dotted lines to the position shown in continuous line. The heel-forming part 26 is blocked in active position by the semi-cylindrical part 26*a* abutting against the rear extreme face of unit 4 and also by the lever arm 26, the spring 27 having a very weak return force. The user who wants to recover the tuner control unit 4 presses the push element 29 towards the left with respect to FIG. 8 so as to pivote the lever arm 28 in a direction corresponding to the tilting of the heel-forming part 26 towards its awaiting position in dotted lines. During this tilting of the heel-forming part 26 the semi-cylindrical part 26*a* pushes back the unit 4 towards the right in the direction of arrow F2 in order to partly eject it from its housing 5.

Advantageously, a stroke end contact (not shown) is associated with the heel-forming part 26 to permit supplying the amplifying unit 3-unit 4 assembly with electrical power when the latter is in the inserted position as shown in FIG. 8.

Various modifications can be made in the two above described embodiments. Thus, due to the fact that unit 4 according to the second embodiment is laterally inserted into its housing 5, it is possible to insert a maximum number of keys higher than the eight keys already shown for ensuring other functions such as memory functions permitting memorizing one or several chosen stations. Moreover, the secret code memorized on the removable unit 4 can be magnetically recorded like credit cards and read by a magnetic reading device arranged in the amplifying unit 3. Thus, this confidential code will be recorded on the magnetic card delivered with the material at the time of the purchase, in order to be able to introduce the initial code on a second radio card in case of loss. The ejection device described in the second embodiment can be used also for ejecting the unit 4 of the first embodiment. Finally, a portable casing of the size of a conventional packet of cigarettes, comprising an electric power supply system (electric battery or cell) and amplifiers connected to a small foldable headset will enable the user of the radio card 4 to complete the hearing of the station on which it is connected, outside his vehicle.

I claim:

1. A radio receiving system used in an automotive vehicle, comprising: an amplifying unit for amplifying audio signals, fixed, in an inviolable manner, to a rear face of a dashboard of the vehicle and a tuner control unit for controlling the acquisition and the selection of radio waves, said tuner control unit being removably secured to said amplifying unit, the system further including means for electrically connecting said tuner control unit to said amplifying unit, said tuner control unit including a casing being in the shape of a flat parallelepiped and being approximately equal in size to a credit card, said amplifying unit including a housing having an opening that is complementary in shape to the shape of the tuner control unit, said tuner control unit being insertable through a rectangular opening in the dashboard and into said amplifying unit housing opening to electrically connect said tuner control unit to said amplifying unit, said tuner control unit includes a part which carries control elements for searching for particular radio wave frequencies and for selecting radio waves and a device for displaying the status of the radio system, when said tuner control unit is inserted into said amplifying unit said part of said tuner control unit extends from said amplifying unit so as to be visibly external thereto, said electrical connecting means comprising first and second connecting elements, said first connecting elements being provided directly on the casing of the tuner control unit side by side at the rearwards part of the casing opposite to the external visible part, said second connecting elements being provided within the amplifying unit housing such that said second connecting elements faces said first connecting elements when said tuner control unit is inserted in said amplifying unit housing opening to transmit signals between said tuner control and amplifying units, said first and second connecting elements form a capacitive coupling-type connection for transmitting high frequency signals coming from an antenna to high frequency circuits of the tuner control unit, a capacitive coupling-type connection for transmitting low frequency signals from the tuner control unit to a low frequency amplifier of the amplifying unit, an electromagnetic coupling-type connection for the power supply of the tuner control unit, said capacitive-type connection for transmitting high frequency signals comprises two capacitors each formed of two metal plates disposed opposite to each other when the tuner control unit is positioned inside said amplifying unit housing, one of said capacitors being positioned in said amplifying unit and the other of said capacitors being positioned in said tuner control unit, said capacitors being separated by a plate made from a dielectric material and fixed to the tuner control unit.

2. The system according to claim 1, wherein the display device is of the liquid crystal type and the control elements are keys of the touch contact type.

3. The system according to claim 1, wherein the amplifying unit further comprises two housings for receiving respectively one analog or digital cassette and one laser reading disc.

4. The system according to claim 1, wherein said electrical connecting means comprises plugging means having one connector at the bottom of the casing including a certain number of resilient metallic contact strips forming said second connecting elements and, located on the upper face of the tuner control unit rearwards thereof, a certain number of contact plugs forming said first connecting elements cooperating respectively with the metallic strips.

5. The system according to claim 1, wherein the visible part of the tuner control unit rests on a pedestal made of hard rubber and fixed to the front face of the stationary part of the vehicle.

6. The system according to claim 1, wherein a secret code is memorized in the tuner control unit and is compared to another secret code memorized in the amplifying unit and wherein the putting in operation of the system is validated in case of matching of the two secret codes, the comparison occurring as soon as the amplifying unit is supplied.

7. A radio receiving system used in an automotive vehicle, comprising: an amplifying unit for amplifying audio signals, fixed, in an inviolable manner, to a rear face of a dashboard of the vehicle and a tuner control unit for controlling the acquisition and the selection of radio waves, said tuner control unit being removably secured to said amplifying unit, the system further including means for electrically connecting said tuner control unit to said amplifying unit, said tuner control unit including a casing being in the shape of a flat parallelepiped and being approximately equal in size to a credit card, said amplifying unit including a housing having an opening that is complementary in shape to the shape of the tuner control unit, said tuner control unit being insertable through a rectangular opening in the dashboard and into said amplifying unit housing opening to electrically connect said tuner control unit to said amplifying unit, said tuner control unit includes a part which carries control elements for searching for particular radio wave frequencies and for selecting radio waves and a device for displaying the status of the radio system, when said tuner control unit is inserted into said amplifying unit said part of said tuner control unit extends from said amplifying unit so as to be visibly external thereto, said electrical connecting means comprising first and second connecting elements, said first connecting elements being provided directly on the casing of the tuner control unit side by side at the rearwards part of the casing opposite to the external visible part, said second connecting elements being provided within the amplifying unit housing such that said second connecting elements faces said first connecting elements when said tuner control unit is inserted in said amplifying unit housing opening to transmit signals between said tuner control and amplifying units, said first and second connecting elements form a capacitive coupling-type connection for transmitting high frequency signals coming from an antenna to high frequency circuits of the tuner control unit; a capacitive coupling-type connection for transmitting low frequency signals from the tuner control unit to a low frequency amplifier of the amplifying unit; and an electromagnetic coupling-type connection for the power supply of the tuner control unit, said capacitive-type connection for transmitting high frequency signals comprises three capacitors for each stereophonic channel and one for return of current and each comprising two metallic plates disposed opposite to each other in the inserted position of the control unit inside said amplifying unit housing, located respectively in the amplifying unit and in the tuner control unit and separated by a plate made of a dielectric material and fixed to the plate of the tuner control unit.

8. The system according to claim 7, wherein said capacitive-type connection for transmitting low frequency signals comprises at least three capacitors for each stereophonic channel and one for return of current and each comprising two metallic plates disposed opposite to each other in the inserted position of the tuner control unit inside housing, located respectively in the amplifying unit and in the tuner control unit, and separated by a plate made of a dielectric material with fixed to the plate of the tuner control unit.

9. The system according to claim 8, wherein said dielectric material has a relative permittivity of about 500 to about 2000.

10. The system according to claim 7, further comprising a mechanical device released at the time of the insertion of the tuner control unit into the housing for pressing the rear part of the tuner control unit in order to perfectly ensure said connections.

11. The system according to claim 7, further comprising an element for controlling the ejection of the tuner control unit out of the housing.

12. A radio receiving system used in an automotive vehicle, comprising: an amplifying unit for amplifying audio signals, fixed, in an inviolable manner, to a rear face of a dashboard of the vehicle and a tuner control unit for controlling the acquisition and the selection of radio waves, said tuner control unit being removably secured to said amplifying unit, the system further including means for electrically connecting said tuner control unit to said amplifying unit, said tuner control unit including a casing being in the shape of a flat parallelepiped and being approximately equal in size to a credit card, said amplifying unit including a housing having an opening that is complementary in shape to the shape of the tuner control unit, said tuner control unit being insertable through a rectangular opening in the dashboard and into said amplifying unit housing opening to electrically connect said tuner control unit to said amplifying unit, said tuner control unit includes a part which carries control elements for searching for particular radio wave frequencies and for selecting radio waves and a device for displaying the status of the radio system, when said tuner control unit is inserted into said amplifying unit said part of said tuner control unit extends from said amplifying unit so as to be visibly external thereto, said electrical connecting means comprising first and second connecting elements, said first connecting elements being provided directly on the casing of the tuner control unit side by side at the rearwards part of the casing opposite to the external visible part, said second connecting elements being provided within the amplifying unit housing such that said second connecting elements faces said first connecting elements when said tuner control unit is inserted in said amplifying unit housing opening to transmit signals between said tuner control and amplifying units, said first and second connecting elements form a capacitive coupling-type connection for transmitting high frequency signals coming from an antenna to high frequency circuits of the tuner control unit; a capacitive coupling-type connection for transmitting low frequency signals from the tuner control unit to a low frequency amplifier of the amplifying unit; and an electromagnetic coupling-type connection for the power supply of the tuner control unit, said electromagnetic coupling-type connecting comprising two coupled windings located respectively in the amplifying unit at an output of a direct current-alternating current convertor and in the tuner control unit.

* * * * *